(12) United States Patent
Goldfarb

(10) Patent No.: US 9,057,957 B2
(45) Date of Patent: Jun. 16, 2015

(54) EXTREME ULTRAVIOLET (EUV) RADIATION PELLICLE FORMATION METHOD

(71) Applicant: International Business Machines Corporation, Armonk, NY (US)

(72) Inventor: Dario L. Goldfarb, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 13/916,946

(22) Filed: Jun. 13, 2013

(65) Prior Publication Data

US 2014/0370423 A1    Dec. 18, 2014

(51) Int. Cl.
*G03F 1/22* (2012.01)
*G03F 1/50* (2012.01)

(52) U.S. Cl.
CPC ........................................ *G03F 1/22* (2013.01)

(58) Field of Classification Search
CPC ......................................................... G03F 1/22
USPC .............................................. 430/5; 204/263
See application file for complete search history.

(56) References Cited

U.S. PATENT DOCUMENTS

| | | | |
|---|---|---|---|
| 5,928,817 A | 7/1999 | Yan et al. | |
| 6,253,464 B1 | 7/2001 | Klebanoff et al. | |
| 6,492,067 B1 | 12/2002 | Klebanoff et al. | |
| 6,623,893 B1 | 9/2003 | Lyons et al. | |
| 6,646,720 B2 | 11/2003 | Ramamoorthy et al. | |
| 7,153,615 B2 | 12/2006 | Bristol et al. | |
| 7,413,586 B2 | 8/2008 | Ramamoorthy et al. | |
| 7,666,555 B2 | 2/2010 | Goldstein et al. | |
| 7,723,704 B2 | 5/2010 | Wood, II et al. | |
| 7,767,985 B2 | 8/2010 | Okoroanyanwu et al. | |
| 7,901,846 B2 | 3/2011 | Kubota et al. | |
| 7,911,588 B2 | 3/2011 | Yonekawa et al. | |
| 7,919,217 B2 | 4/2011 | Kubota et al. | |
| 7,951,513 B2 | 5/2011 | Kubota et al. | |

(Continued)

FOREIGN PATENT DOCUMENTS

| EP | 2124102 A2 | 11/2009 |
|---|---|---|
| EP | 2051139 B1 | 11/2010 |

(Continued)

OTHER PUBLICATIONS

Kang et al., "Novel Method of Thick Porous Silicon Membrane Formation", International Conference on Electrical Engineering 2002.

(Continued)

*Primary Examiner* — Stephen Rosasco
(74) *Attorney, Agent, or Firm* — Michael LeStrange; Hoffman Warnick LLC

(57) ABSTRACT

An extreme ultraviolet (EUV) photolithography pellicle with at least 70% transmissivity to EUV can be formed from a layer of semiconductor material applied to a substrate. The bottom surface of the layer can be exposed by forming support structure(s) from the substrate. Semiconductor material between the exposed surfaces can become the pellicle by anodizing until an objective is reached, such as a particular transmissivity, range of size of pores formed, pellicle region thickness, elapse of a period, and/or another objective indicative of 70% transmissivity to EUV for the semiconductor material between the exposed surfaces.

20 Claims, 10 Drawing Sheets

(56) References Cited

U.S. PATENT DOCUMENTS

| | | |
|---|---|---|
| 8,018,578 B2 | 9/2011 | Banine et al. |
| 2011/0065278 A1 | 3/2011 | Kim |
| 2012/0045714 A1 | 2/2012 | Akiyama et al. |
| 2012/0183757 A1 | 7/2012 | Akiyama et al. |

FOREIGN PATENT DOCUMENTS

| | | |
|---|---|---|
| EP | 2113809 B1 | 6/2011 |
| EP | 2423747 A1 | 2/2012 |
| EP | 2477072 A1 | 7/2012 |
| EP | 2518563 A1 | 10/2012 |

OTHER PUBLICATIONS

Ko et al., "Effect of Extreme-ultraviolet Pellicle Support to Patterned Mark", Proc. of SPIE vol. 8322, 2012.

Velleman et al., "Fabrication of self-supporting porous silicon membranes and tuning transport properties by surface functionalization", Nanoscale, 2010, 2, 1756-1761.

Moors et al., "Electricostatic mask protection for extreme ultraviolet lithography", Journal of Vacuum Science and Technology B, 20, 316, 2002.

Oh, Hye-Keun, "EUV Pellicles" Hanyang University, Oct. 23, 2012.

Scaccabarozzi et al, "Investigation of EUV pellicle feasibility", Proc. of SPIE vol. 8679, 2013.

Shroff et al., "EUV Pellicle Development for Mask Defect Control", Proc. of SPIE, vol. 6151, 2006.

Shroff et al., "High transmission pellicles for extreme ultraviolet lithography reticle protection", Journal of Vacuum Science and Technlogy B, 28(6), Nov./Dec. 2010.

Arrand, "Porous Silicon", Chapter 2, Optical Wavguides and Components Based on Porous Silicon, 1997, http://www.nottingham.ac.uk/ggiemr/publications/hfa_thesis.htm.

Ducso et al., "Porous Silicon Bulk Micromachining for Thermally Isolated Membrane Formation," Sensors and Actuators A 60, pp. 235-239, 1997.

Akiyama et al., "Realization of EUV Pellicle with Single Crystal Silicon Membrane," Presentation to 2009 International EUVL Symposium, Prague, Czech, 2009.

US 9,057,957 B2

EXTREME ULTRAVIOLET (EUV) RADIATION PELLICLE FORMATION METHOD

BACKGROUND

The present invention relates to photolithography used in the microfabrication of semiconductor devices, and, more specifically, to methods of forming a porous silicon film, particularly for use as a pellicle to protect an extreme ultraviolet radiation photomask or reticle.

It is common to employ ultraviolet (UV) radiation in photolithography to transfer a pattern onto an article to be processed, such as a semiconductor wafer. As semiconductor devices continue to be reduced in scale, shorter wavelengths of radiation are preferred. As a result, techniques have been developed in which extreme ultraviolet (EUV) radiation can be used in the microfabrication of semiconductor devices to form components and/or patterns at even smaller scales than more conventional UV photolithography allows, such as features with dimensions in the order of 20 nanometers (nm) or smaller. EUV radiation is often regarded as including wavelengths of from about 4 nm to about 40 nm, which roughly corresponds to frequencies of about 75 petaHertz (PHz) to about 7.5 PHz and/or photon energies of from about 310 electron-volts (eV) to about 31 eV. However, EUV light is highly absorbed by most known materials, which can result in flaws in pattern transfer should undesired particles lay between the EUV radiation source and the article to be processed. To reduce introduction of such particles, a pellicle can be placed in front of a photomask, but such a pellicle can result in significant reduction in EUV radiation transmittance to the photomask and article.

One approach to avoid EUV radiation transmittance reduction is to create a thermal gradient over an article to be processed and/or the photomask, which can avoid use of a pellicle at all. The article, photomask, and/or support structure is heated so that convection currents can form and flow away from the photomask, carrying undesirable particles away, as well. However, this approach may not be as effective in processes in which vacuum is employed. In addition, should gas or particles surround the photomask, the convection currents could draw particles to the photomask.

A related approach is to place an electrostatic charge on the photomask, the article to be processed, and/or support structure. By using a charge similar to that possessed by undesirable particles, the particles can be repelled. This approach may not be as effective where particles of mixed charges are present and/or where a charge could damage the photomask, support structure, and/or article.

Another approach is to use a pellicle, but to remove the pellicle just before exposing the photomask. The photomask in this example is typically in a box sealed by a removable pellicle. The box is inserted into a vacuum chamber in which the article is to be exposed to EUV radiation, the pellicle is removed, the article is exposed, the pellicle is replaced, and the box is withdrawn. This approach may not be effective against particles produced from rubbing parts of the box or elsewhere in the vacuum chamber during exposure.

A further approach is to form a permanent pellicle on the box from a highly EUV transmissive material. For example, a very thin layer or film of a material, such as silicon, can be highly transmissive of EUV radiation and used as a pellicle to cover a photomask box. Similarly, an aerogel membrane of a material, such as silicon, can be formed as a highly EUV transmissive pellicle for a photomask box. Such pellicles typically are very thin and/or of very low density, however, which can result in undesirable deflection and/or breakage.

SUMMARY

According to one embodiment of the present invention, a method of forming an extreme ultraviolet (EUV) pellicle for protection of a photomask can include preparing a pellicle region of a pellicle layer of a semiconductor material. The pellicle layer can be formed by applying a layer of the semiconductor material to an exposed surface of a substrate. At least one support structure can be formed from the substrate, and a portion of the substrate can be removed to expose a pellicle region of a previously covered bottom surface of the pellicle layer. At least the pellicle region of the pellicle layer can be anodized until a transmissivity of the pellicle region to EUV electromagnetic radiation including a range of wavelengths of electromagnetic radiation of from about 4 nanometers to about 125 nanometers reaches at least a desired transmissivity value.

Another embodiment of the invention disclosed herein can include a method of forming a pellicle with at least a desired transmissivity in a range of wavelengths in the electromagnetic radiation spectrum of from about 4 nanometers to about 125 nanometers. A pellicle layer of a semiconductor material can be applied to a wafer that includes at least a substrate layer. Protective layers can be applied to a bottom surface of the wafer and a top surface of the pellicle layer, and at least one masking element can be applied to the bottom protective layer. Removing an unmasked portion of the bottom protective layer can expose a portion of a bottom of the wafer, which can be removed while removing the at least one masking element to expose at least one corresponding remaining portion of the bottom protective layer. What remains of the protective layers can be removed to expose a portion of a lower surface of the substrate layer and at least a portion of a top surface of the pellicle layer corresponding to the exposed bottom surface of the pellicle layer, thereby forming a processing article. The pellicle can be formed in a pellicle region of the pellicle layer at least corresponding to the exposed portion of the bottom surface of the pellicle layer by anodizing at least the pellicle region of the processing article.

A further embodiment of the invention disclosed herein can include a method of forming an extreme ultraviolet (EUV) porous semiconductor pellicle for protecting a photolithographic photomask, the pellicle having a transmissivity of at least 70% in a range of wavelengths in the electromagnetic radiation spectrum of from about 10 nanometers to about 125 nanometers. A pellicle layer of a semiconductor material can be formed on a wafer, which wafer can include at least a handle wafer, a bottom oxide (BOX) layer, and a substrate layer. A bottom protective layer can be applied to a bottom surface of the handle wafer, and a top protective layer can be applied to a top surface of the pellicle layer. At least one masking element can be applied and/or attached to the bottom protective layer, and an unmasked portion of the bottom protective layer can be removed to expose a portion of a bottom of the handle wafer. The at least one masking element can be removed to expose at least one corresponding remaining portion of the bottom protective layer, and the exposed portion of the bottom of the handle wafer can be removed, as well as a portion of a bottom of the BOX layer exposed thereby, to expose a portion of a bottom of the substrate layer. The exposed portion of the bottom of the substrate layer, a remaining portion of the bottom protective layer, and the top protective layer can be removed to expose a portion of a lower surface of the pellicle layer and at least a portion of a top surface of the pellicle layer corresponding to the exposed bottom surface of the pellicle layer, thereby forming a processing article. The processing article can then be anodized to form the pellicle throughout a pellicle region of the pellicle layer at least corresponding to the exposed portion of the bottom surface of the pellicle layer to form the pellicle.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

It is noted that the drawings of the invention are not necessarily to scale, are intended to depict only typical aspects of the invention, and therefore should not be considered as limiting the scope of the invention. It is understood that elements similarly numbered between the FIGURES may be substantially similar as described with reference to one another. Further, in embodiments shown and described with reference to FIGS. 1-15, like numbering may represent like elements. Redundant explanation of these elements has been omitted for clarity. Finally, it is understood that the components of FIGS. 1-15 and their accompanying descriptions may be applied to any embodiment described herein.

DETAILED DESCRIPTION

Embodiments of the invention disclosed herein provide a method of forming and/or making a membrane or film or layer of material that provides at least 70% transmission of extreme ultraviolet (EUV) radiation, including at least 90% transmission, yet possesses characteristics that render the membrane/film/layer much more resistant to deflection and/ or breakage. A layer of material can be formed by conventional techniques and can be supported by a frame or the like. By electrochemical processes employed as described herein, the layer of material can be transformed into a highly EUV-transmissive pellicle. For example, a layer of silicon can be formed through known processes, such as chemical vapor deposition (CVD), at a desired thickness. The layer can then be exposed to a reactive solution in an electrical potential, such as in an anodizing process, so that the silicon layer becomes porous. Even at thicknesses far in excess of those of solid silicon pellicles and aerogel pellicles, the layer can be 90% EUV transmissive, while the layer thickness can result in a material strength also far in excess of solid and/or aerogel pellicles.

Figure 1:
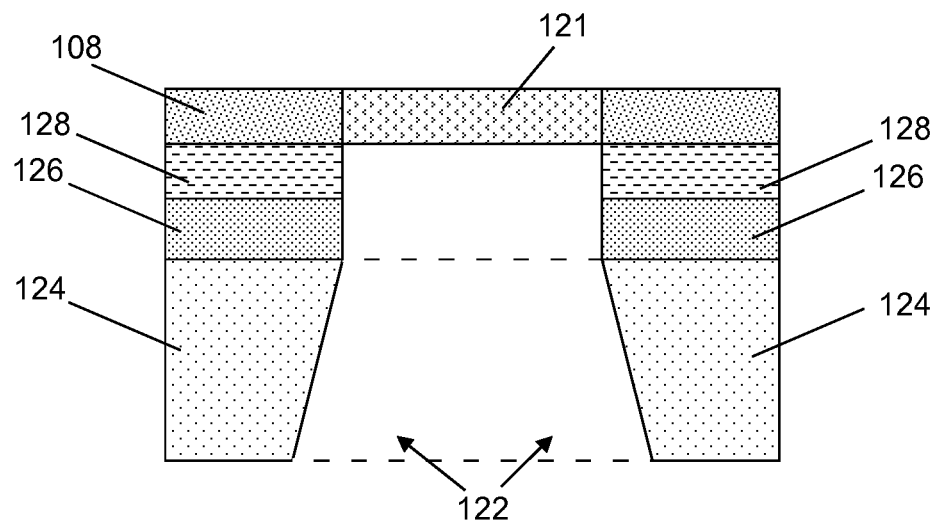
FIG. 1 is a schematic illustration of a cross sectional view of an EUV pellicle according to an embodiment of the invention disclosed herein.

With reference now to the accompanying drawings, and particularly to FIG. 1, embodiments of the invention contemplate forming a porous semiconductor pellicle 121 in a pellicle layer 108 of semiconductor material. Pellicle layer 108 can be supported by a support structure 122, which, depending on what type of material(s) is used as a base, can each include a handle wafer portion 124, a buried oxide (BOX) layer portion 126, and/or a substrate layer portion 128, as will be explained below. It should be apparent that while support structure 122 appears as two separate structures in the cross sectional views of the FIGS., support structure 122 can be a single structure. For example, a starting wafer 100 such as that shown in FIG. 2 can have a substantially cylindrical shape so that after processing support structure 122 (FIG. 1) is a single substantially annular and/or frustro-pyramidal frame. While a cylindrical shape of wafer 100 is offered as an example, it should be apparent that wafer 100 could have any suitable and/or desired and/or available polyhedral shape.

Figure 2:
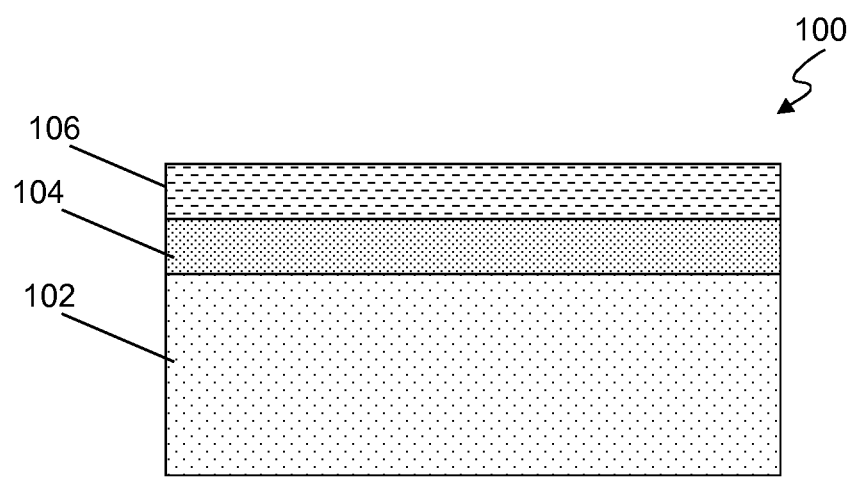
FIGS. 2-10 are schematic illustrations of stages of forming an EUV pellicle according to an embodiment of the invention disclosed herein and as shown in FIG. 1.
Figure 3:
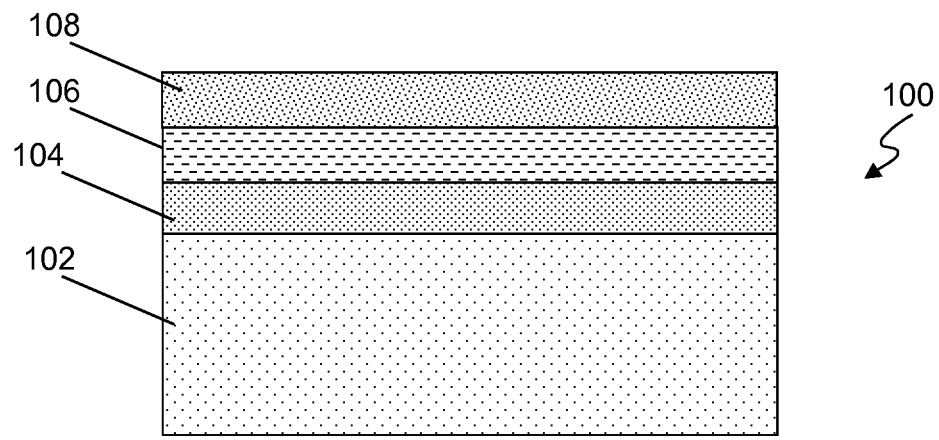

Turning to FIG. 2, embodiments contemplate starting with an appropriate base structure, such as a silicon-on-insulator (SOI) wafer shown in FIG. 2. Wafer 100 can include a handle wafer 102 bearing a bottom oxide (BOX) layer 104, which can bear a substrate layer 106. Continuing to FIG. 3, a pellicle layer 108 can be formed on and/or applied to substrate layer 106, such as by epitaxial deposition of a layer of semiconductor material. Handle wafer 102, substrate layer 106, and pellicle layer 108 can include any suitable monocrystalline, polycrystalline, and/or amorphous semiconductor material, such as silicon and/or mixtures including silicon, germanium, gallium, indium, and/or other semiconductors, and/or can include dopants, such as boron, phosphorous, and/or arsenic, as may be known in the art. Likewise, BOX layer 104 can include any suitable insulating material, such as, for example, silicon dioxide. In addition, pellicle layer 108 can include a dopant to enhance conductivity of pellicle layer 108. The dopant can include a p-type dopant, such as boron or gallium, or an n-type dopant, such as phosphorous or arsenic, should such be appropriate and/or desired, which can be included in pellicle layer 108 through any suitable technique as may be known in the art, such as, for example, diffusion, ion implantation, and/or any other technique known to those skill in the art. It should be recognized that materials named above are for example only and are in no way limiting, since other materials can also be suitable for use in embodiments.

Figure 4:
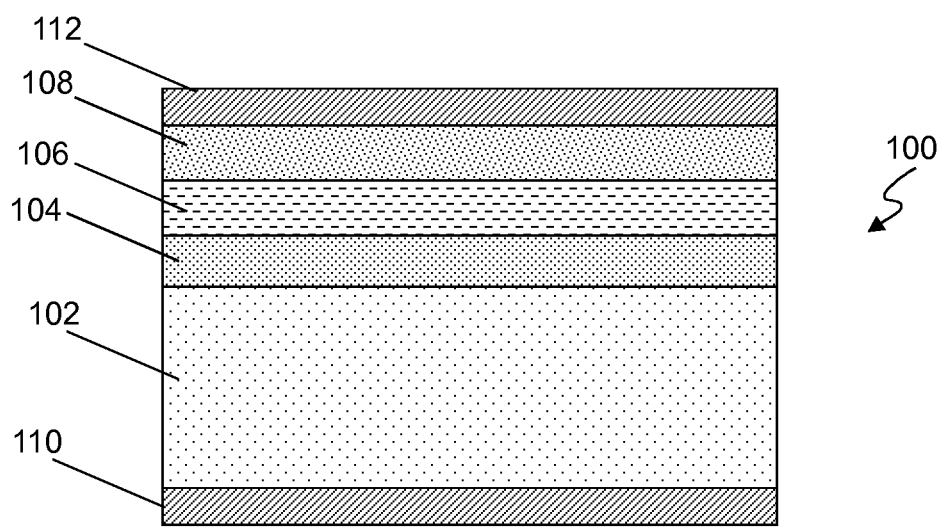
Figure 5:
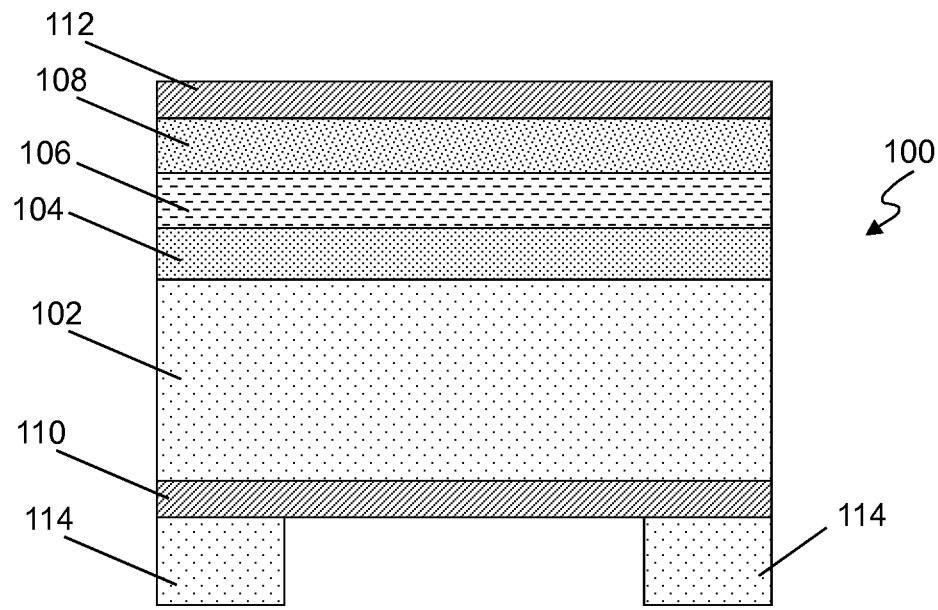
Figure 6:
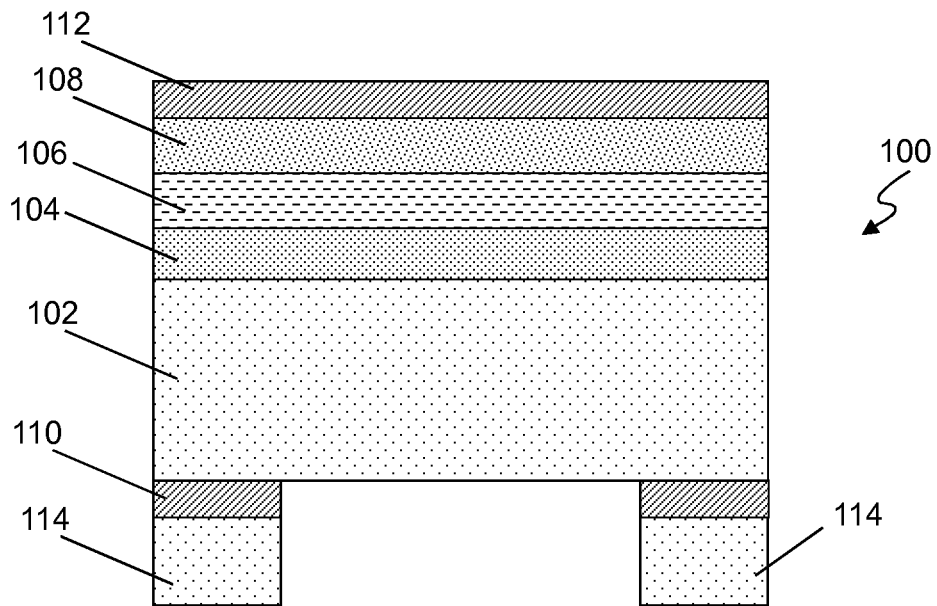

As seen in FIG. 4, a bottom protective layer 110 can be applied to handle wafer 102, and a top protective layer 112 can be applied to pellicle layer 108. In embodiments, one or both of bottom and top protective layers 110, 112 can include silicon nitride, though any other suitable material can be employed. For example, where wet silicon etchants are employed to remove material, any suitable material resistant to wet silicon etchants can be used to form one or both of protective layers 110, 112. Anisotropic wet silicon etchants include alkali hydroxides, such as lithium hydroxide (LiOH), sodium hydroxide (NaOH), and potassium hydroxide (KOH), as well as tetraalkylammonium hydroxides, such as tetramethylammonium hydroxide and tetraethylammonium hydroxide. Continuing to FIG. 5, a portion of handle wafer 102 and bottom protective layer 110 can be masked, such as using one or more masking elements 114, particularly backside contact dry etch masking elements, in preparation for removal of unmasked portions of protective layer 110. For example, mask elements 114 can include pieces of cleaved silicon or another suitable material attached to bottom masking layer 110. With additional masking complete, unmasked portions of protective layer 110 can be removed, such as by reactive ion etching (RIE), as shown in FIG. 6, in which masking elements 114 remain, but an unmasked portion of bottom protective layer 110 is gone, exposing a portion of handle wafer 102. It should be noted that masking elements 114 can be a single masking element 114 that appears as two elements in cross section. For example, where wafer 100 is cylindrical, masking element 114 can be substantially annular, though other shapes for wafer 100 and/or masking element 114 can be employed as may be desired and/or suitable.

Figure 7:
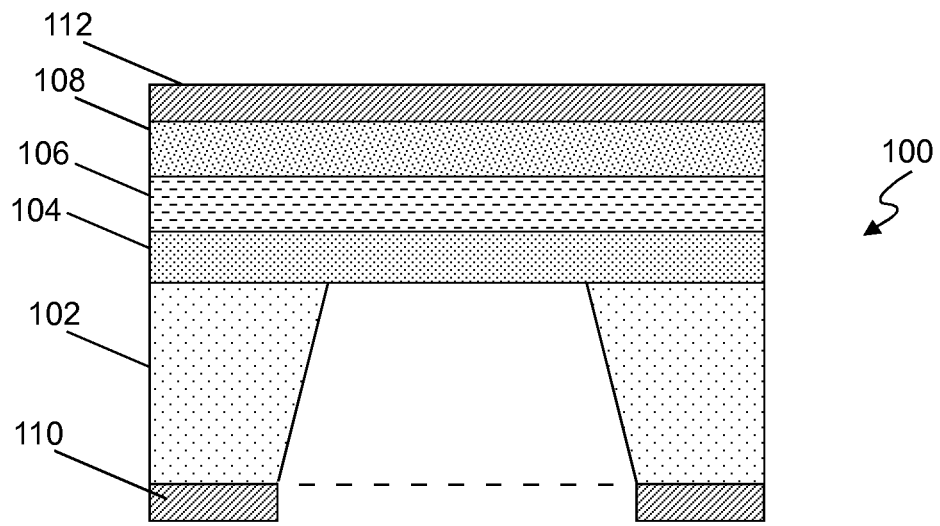
Figure 8:
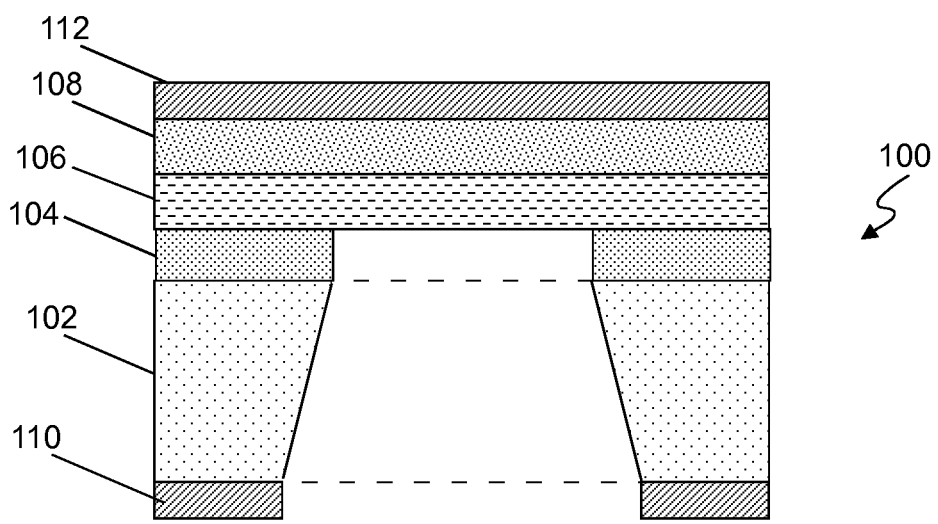
Figure 9:
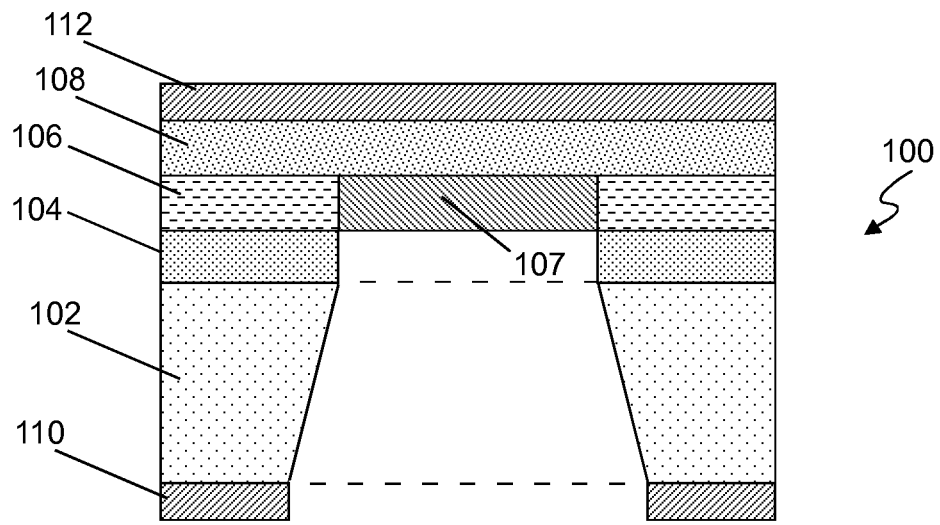

With reference to FIG. 7, the exposed portion of handle wafer 102 and masking elements 114 can be removed, such as by anisotropic wet etching, to expose a portion of BOX layer 104, such as a portion of a bottom surface thereof. The exposed portion of BOX layer 104 can then be removed, such as by buffered oxide etchant (BOE), to expose an underside of substrate layer 106, as shown in FIG. 8. Oxidation can then be optionally employed, such as high temperature oxidation, to oxidize the exposed portion of substrate layer 106, as well as remaining portions of protective layers 110, 112, yielding an oxidized portion 107 of substrate layer 106 as illustrated in FIG. 9.

Figure 10:
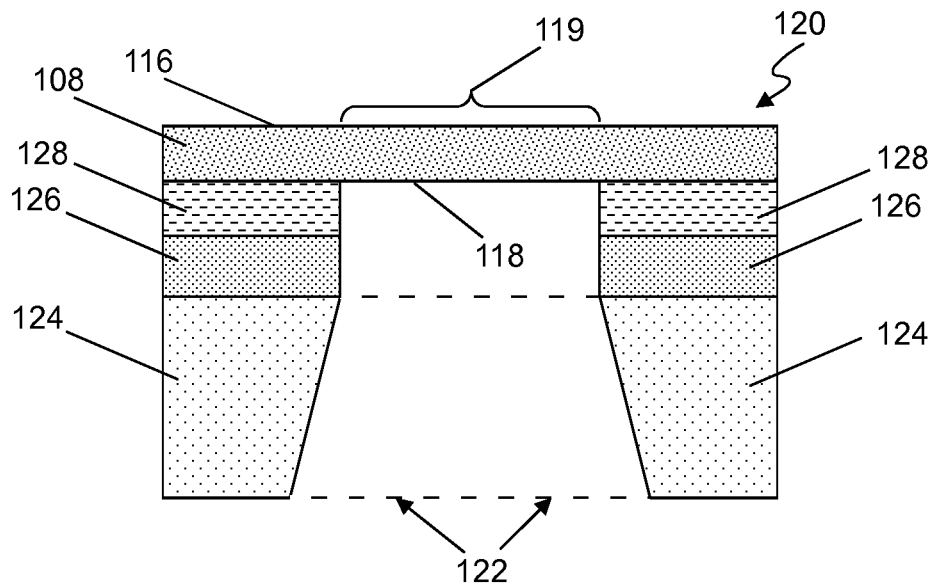
Figure 12:
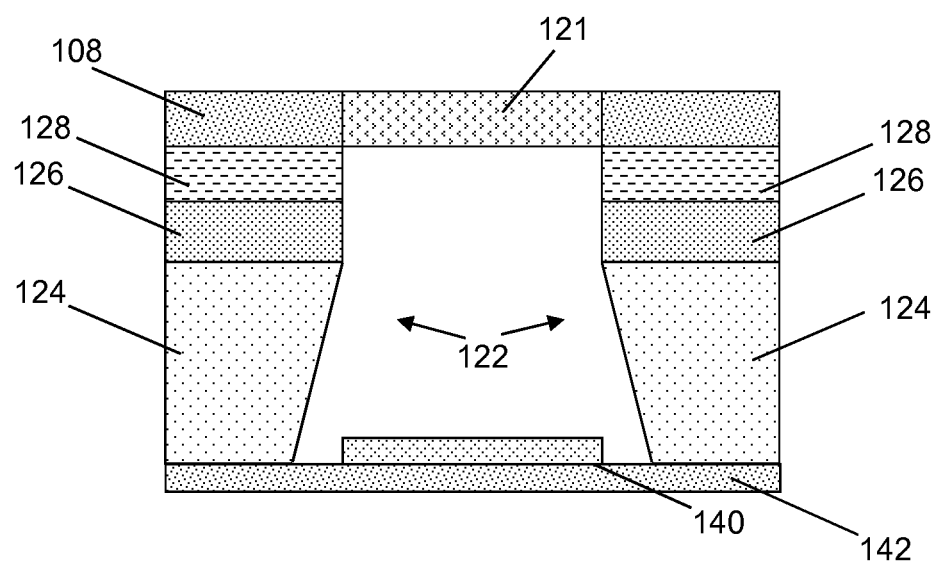
FIG. 12 is a schematic illustration of a cross sectional view of an EUV pellicle with a photomask/support attached according to an embodiment of the invention disclosed herein.

Turning to FIG. 10, a pellicle processing article 120 can result from removing the exposed portions of substrate layer 106 and masking layers 110, 112 to expose a top surface 116 and a portion of a bottom surface 118 of pellicle layer 108. Where oxidation has been performed, pellicle processing article 120 can instead result from removing oxidized portion 107 of substrate layer 106, oxidized remaining portions of masking layer 110, and oxidized top masking layer 112, such as with a BOE process. A pellicle region 119 of pellicle layer 108 can include at least a portion of pellicle layer 108 that overlies the exposed portion of bottom surface 118. Article 120 can include support structure 122, having a handle wafer portion 124 and a BOX portion 126, which supports pellicle layer 108, which can then be processed according to embodiments. For example, pellicle processing article 120 can be anodized, as will be explained below, to form pellicle 121 in layer 108, supported by support structure 122, as seen in FIG. 12. As discussed above, support structure 122 in embodiments can be a single structure that appears as separate legs in cross section.

While a SOI wafer has been used as an example of a starting material for processing article 120, it should be apparent that other types of wafers and/or additional processes could be employed to produce a processing article within the scope of embodiments of the invention disclosed herein. For example, a wafer of silicon could be used as a starting point, and a layer of oxide or another etch-stop material could be applied or formed on a top surface of the wafer. Silicon could be applied over the oxide layer to form a pellicle layer, and processes similar to those shown in FIGS. 4-10 could be used to yield a processing article with a pellicle region ready to be processed into a pellicle. Similarly, while legs/support structure 122 has been provided as an example of a way to support the pellicle region 119, other and/or additional support structures could be used within the scope of embodiments of the invention disclosed herein.

Figure 11:
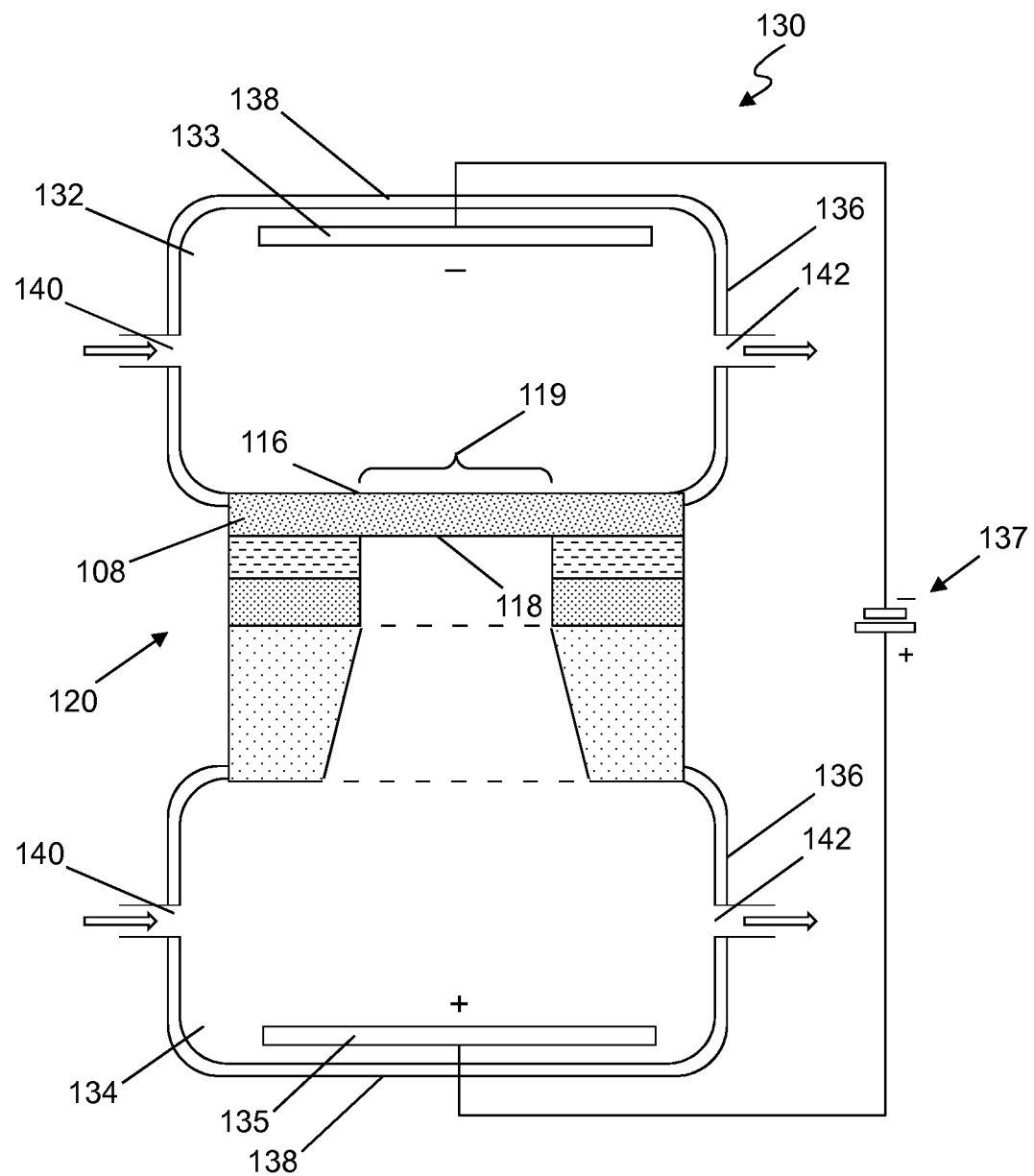
FIG. 11 is a schematic diagram of an apparatus or device that can be used in forming an EUV pellicle according to an embodiment of the invention disclosed herein.

With reference to FIG. 11, an anodizer 130 can be used with pellicle processing article 120 to form pellicle 121 (FIG. 1). A fluid-tight first chamber 132 and a fluid-tight second chamber 134 can be formed and/or mounted on either side of pellicle layer 108. Each chamber can include a first wall 136 substantially perpendicular to top surface 116 of pellicle layer 108 and an end wall 138. Where chambers 132, 134 are cylindrical, first wall 136 can be substantially annular and end wall 138 can be substantially circular so that each chamber 132, 134 can be a cylinder with one closed end and one open end, the open end being attached to and/or around a respective surface 116, 118 of pellicle region 119. Otherwise, additional walls would be needed to form fluid-tight chambers 132, 134.

In embodiments, first chamber 132 can enclose at least a portion of top surface 116, and second chamber 134 can enclose at least an exposed portion of bottom surface 118 of pellicle layer 108, so that both surfaces of pellicle region 119 can be enclosed. Each chamber 132, 134 can include an electrode, such as cathode 133 and anode 135, in a region distal from pellicle layer 108, and the electrodes 133, 135 can be connected to a voltage source 137. An anodizing solution can then be supplied to each chamber 132, 134 so as to contact exposed portions of surfaces 116, 118 of pellicle layer 108, and effectively creating a dual-chambered electrochemical cell. When electrodes 133, 135 have been energized/connected to voltage source 137 and anodizing solution is in the chambers 132, 134, anodization of surface 116 can be initiated. Selective electrochemical dissolution of pellicle layer 108 can be induced by the electrical potential between electrodes 133, 135 and the anodizing solution so that pores can form in pellicle region 119. With enough pores in a suitable range of sizes, such as, for example, pores of from about 1 nanometer to about 100 nanometers in size, EUV transmissivity of the material in pellicle region 119 can be increased to at least 70%, including at least 90%, even at relatively large thicknesses, which can preserve strength of the resulting pellicle. The anodizing solution can include any suitable fluid and/or formulation as may be known in the art of electrochemistry that can induce pore formation in pellicle region 119 when electrodes 133, 135 are energized, such as, for example, hydrofluoric acid, and can particularly include a mixture of hydrofluoric acid, water, and/or alkanols, such as methanol, ethanol, and/or isopropanol. As should be apparent, a switch or the like can be included to selectively energize the electrodes.

One or both chambers can include a fluid entry 140, which can also act as a fluid exit in fluid communication with or otherwise connected to a pump and/or reservoir of anodizing solution(s) (not shown), but in other embodiments one or both chambers can also include a fluid and/or gas exit 142 also in fluid communication with or otherwise connected to a pump and/or reservoir of anodizing solution(s) (not shown). Whether a chamber 132, 134 includes only fluid entry 140 or also includes fluid exit 142, anodizer 130 can be used, for example, by filling one or both chambers 132, 134 with anodizing solution to at least immerse respective top or bottom surface 116, 118 of pellicle region 119 and respective electrode 133, 135, which can be energized and/or connected to voltage source 137 until the anodizing solution is chemically depleted and/or otherwise no longer suitable, and/or until an objective is achieved. Some non-limiting examples of such objectives can include a particular thickness of pellicle region 119, elapse and/or passage of a particular period, a particular range of pore sizes, and/or a particular transmissivity of pellicle region 119 to a particular range of wavelengths/frequencies of electromagnetic radiation. The anodizing solution can then be removed, and, if necessary, filling chamber(s) 132, 134 and energizing electrode(s) 133, 135 can be repeated.

In embodiments where one or both chambers 132, 134 include a fluid entry/exit pair 140, 142, anodizer 130 can be used with a pump (not shown) to circulate anodizing solution along and/or against a respective surface 116, 118 of pellicle region 119. Thus, to anodize pellicle region 119 in such embodiments, electrodes 133, 135 can be energized while anodized solution flows and/or circulates past and/or against and/or along top surface 116 and/or bottom surface 118 until an objective is achieve. Again, examples of such an objective can include until a desired thickness of pellicle region 119 is reached, until a particular period has elapsed and/or passed, until pores of a particular range of sizes have formed in pellicle region 119, and/or until a desired transmissivity to electromagnetic radiation in a particular range of wavelengths (and/or corresponding frequencies) has been achieved in pellicle region 119. For example, anodizing can continue until a thickness of pellicle region 119 of from about 10 nm to about 2.5 microns has been reached, until a period of from about 1 to about 10000 seconds has passed or elapsed, until pores of from about 1 nanometer to about 100 nanometers in size have formed in pellicle region 119, and/or until a transmissivity of at least 70% to electromagnetic radiation in a range of wavelengths of from about 4 nanometers to about 125 nanometers (and/or in a range of frequencies of from about 1 PHz to about 75 PHz) has been achieved in pellicle region 119.

After anodization, as shown in FIG. 12, a photomask 140 to be protected can be attached to pellicle 121, such as by attaching the photomask 140 and/or a support structure 142 thereof to the bottoms of legs/support structure 122. Attachment can be performed in vacuum or in another environment in which undesirable particles can be eliminated from between pellicle 121 and photomask 140. Attachment can also be achieved by any suitable technique as may be known in the art to substantially permanently attach photomask 140 and/or structure 142 to support structure 122. For example, spacer elements can be selectively placed at the interface between structure 142 and support structure 122 so as to create gaps that can ensure that air or other fluid can pass therebetween.

Figure 13:
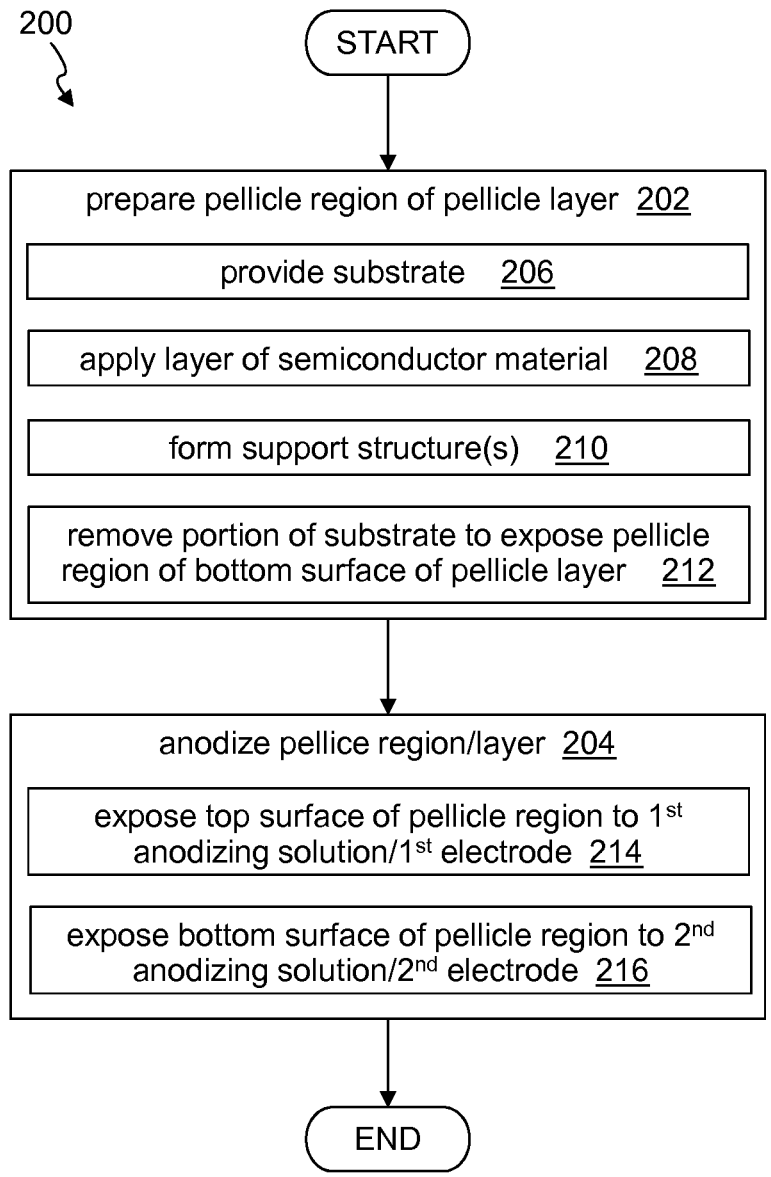
FIG. 13 is a schematic flow diagram of a method of forming an EUV pellicle according to an embodiment of the invention disclosed herein.

Thus, an example of a method of forming an EUV pellicle has been described by way of explaining the examples shown in FIGS. 1-12. A particular example of a method 200 of forming an EUV pellicle according to embodiments of the invention disclosed herein is seen in FIG. 13. Broadly, a pellicle region of a pellicle layer can be prepared (block 202), and the pellicle region can be anodized (block 204) to produce an EUV pellicle. Preparing a pellicle region can include providing a substrate (block 206), such as wafer 100 of FIG. 2, on which can be formed and/or to which can be applied a layer of semiconductor material (block 208), such as pellicle layer 108 shown in FIG. 3. Support structure(s) can be formed (block 210), such as a frame or other single support structure that can appear as legs 122 in cross section as seen in FIG. 10, and a portion of the substrate can be removed to expose a portion of a bottom surface of the pellicle layer (block 212), which can define the pellicle region, such as pellicle region 119 also seen in FIG. 10. Anodizing (block 204) can include exposing the top surface of the pellicle region to a first anodizing solution while a first electrode is energized (block 214), as well as exposing the bottom surface of the pellicle region to a second anodizing solution (block 216). For example, embodiments can use anodizer 130 of FIG. 11 to circulate anodizing solution(s) over top and bottom surfaces 116, 118 of pellicle region 119 while electrodes 133, 135 are energized.

Figure 14:
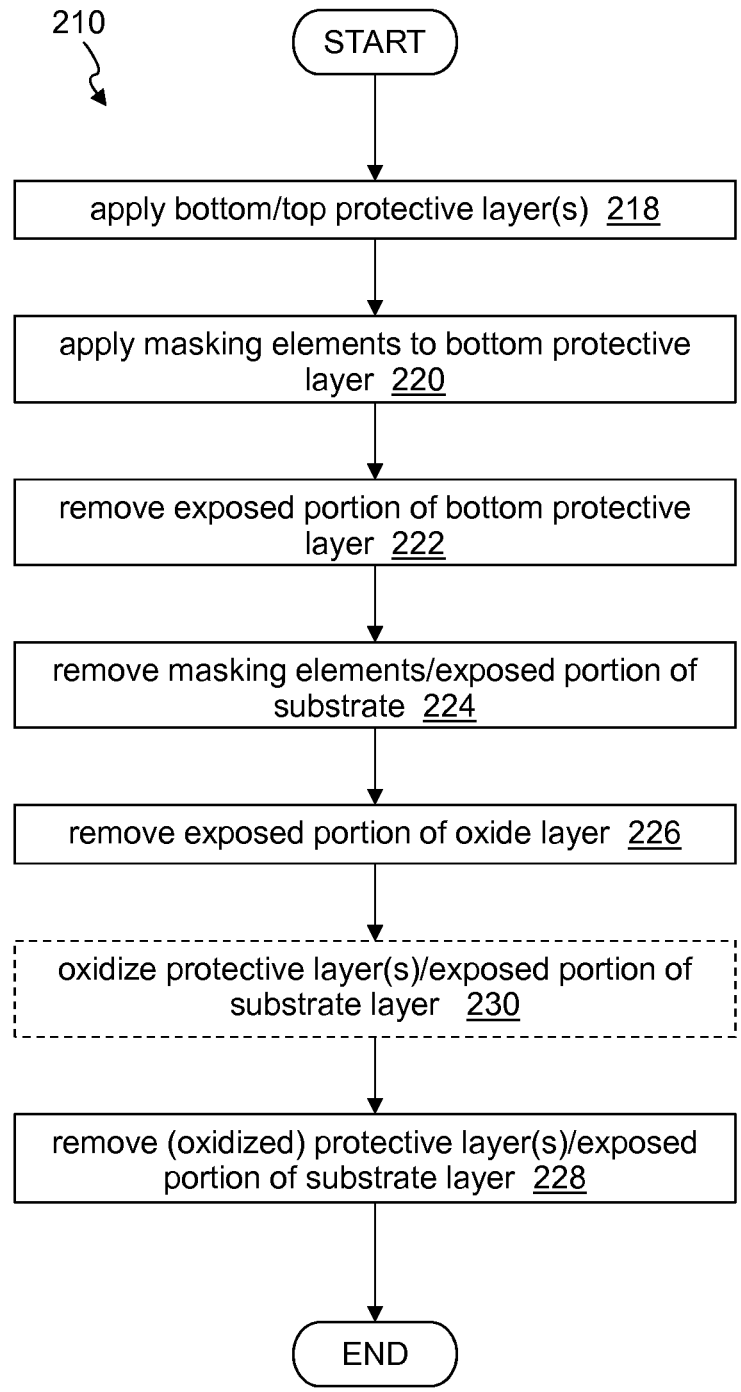
FIG. 14 is a schematic flow diagram of a method of forming an EUV pellicle according to an embodiment of the invention disclosed herein.

An example of forming support structures (block 210) is seen in FIG. 14, in which top and bottom protective layers can be applied to the substrate (block 218), and additional masking elements can be applied to the bottom masking layer (block 220). See FIGS. 4 and 5 and the accompanying description above, in which top and bottom protective layers 110, 112 can be applied to substrate 100, and masking elements 114 can be applied to bottom protective layer 112. An exposed portion of the bottom protective layer can then be removed (block 222), and the masking elements and exposed portion(s) of the substrate can be removed (block 224), which can result in the examples of FIGS. 6 and 7. Where the substrate includes a BOX wafer, removing the exposed portion(s) of the substrate (block 224) can expose a portion of a bottom of the oxide layer, which can then be removed (block 226) to expose a bottom of the substrate layer. See, for example, FIG. 8, where a portion of oxide layer 104 has been removed to expose a bottom and/or bottom surface of substrate layer 106. The exposed portion of the substrate layer and what remains of the protective layer(s) can then be removed (block 228) to yield a pellicle processing article 120, such as in the example shown in FIG. 10. An optional, additional oxidation of the exposed portion of the substrate layer and the masking layer(s) can be done (block 230), such as is shown in the example of FIG. 9, before they are removed (block 228), if so desired and/or suitable.

Figure 15:
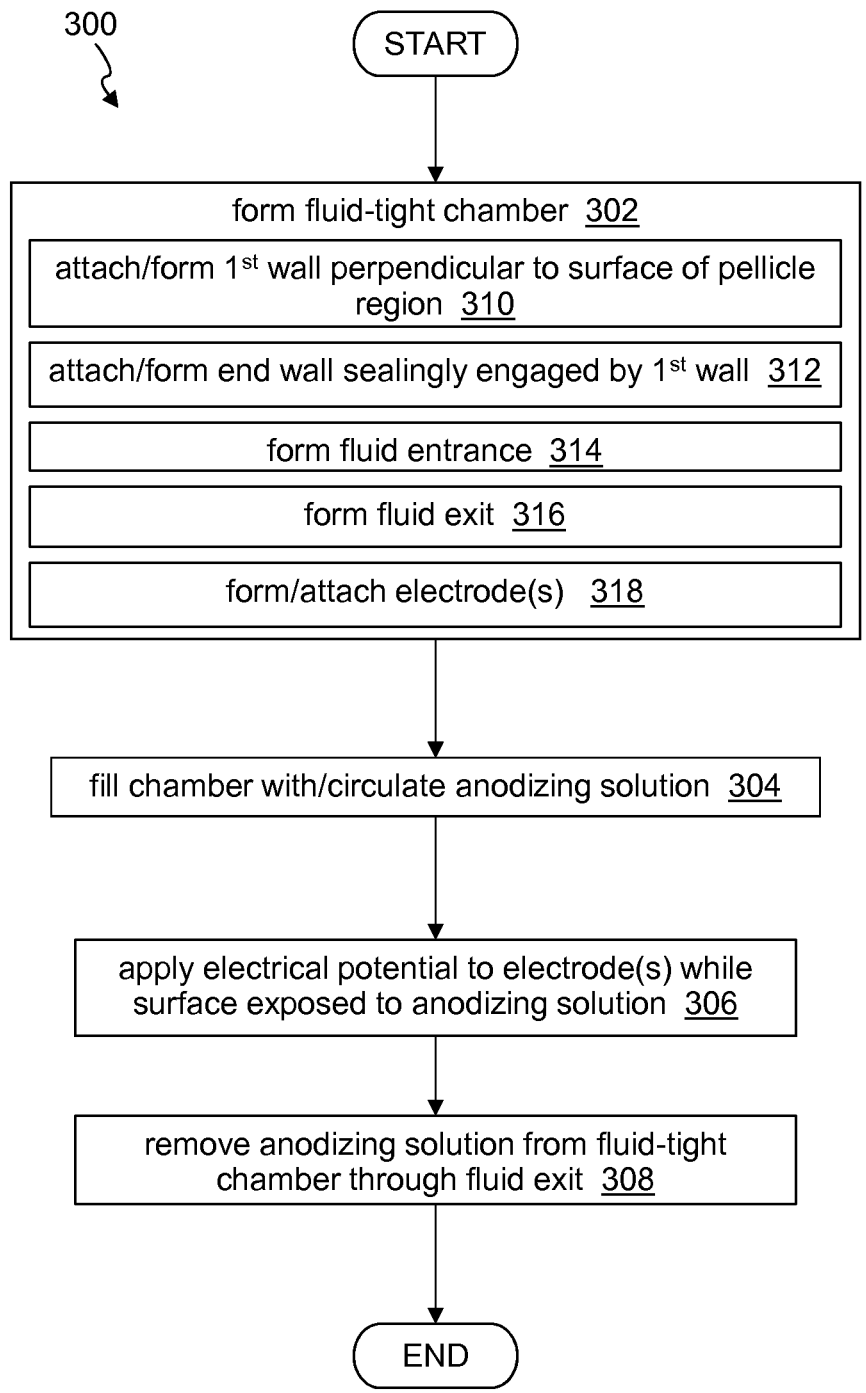
FIG. 15 is a schematic flow diagram of a method of forming an EUV pellicle according to an embodiment of the invention disclosed herein.

An example of a method 300 of anodizing processing article 120 to form pellicle 121 is seen in FIG. 15. A fluid-tight chamber can be formed (block 302) such that the top surface or the bottom surface of the pellicle region can be exposed to an interior of the chamber, the chamber can be filled with an anodizing solution and/or anodizing solution can be circulated through the chamber (block 304) and/or along the surface of the pellicle), and an electrical potential can be applied to the electrode(s) while the surface of the pellicle region is exposed to the anodizing solution (block 306). Once a particular objective has been achieved, the anodizing solution can be removed (block 308). In embodiments in which the chamber is simply filled with anodizing solution, if the solution becomes depleted or otherwise unsuitable before the objective is achieved, filling the chamber, applying electrical potential, and removing the solution can be repeated until the objective is achieved.

Forming a fluid-tight chamber (block 302) can include forming and/or attaching a first wall perpendicular to the surface of the pellicle (block 310), as well as attaching and/or forming an end wall sealingly engaged by the first wall (312), such as by forming the end wall and first wall as one piece and/or attaching the walls in a fluid-tight manner. See the example of FIG. 11, in which a first wall 136 and end wall 138 of each chamber 132, 134 is attached to and/or around processing article 120 such that each of the top and bottom surfaces 116, 118 of pellicle region 119 are at least partly exposed to an interior of a respective chamber 132, 134. A fluid entrance can be formed (block 314) and/or a fluid exit can be formed (block 316), and electrode(s) can be formed and/or attached (block 318) in the chamber. In embodiments, the electrode(s) can be attached/formed before the end wall and/or first wall are attached to the surface of the pellicle. Forming/attaching the electrode(s) can include electrically connecting the electrode(s) to a voltage source. In embodiments, as described above, a chamber can be formed for each surface of the pellicle region. Since each chamber includes an electrode, one electrode can be a cathode, while the other can be an anode, such that the pellicle region sits between the electrodes of a dual-chambered electrochemical cell. Once fluid, such as anodizing solution(s) is present in the chambers, the electrodes can be energized by connecting and/or powering up and/or turning on the voltage source. In embodiments, as suggested above, once the relevant objective has been achieved, the anodized article can be removed and can be attached to a photomask or vice versa, such as in a vacuum chamber or other environment in which undesirable particles and/or other contaminants can be removed and/or prevented from moving between the pellicle and the photomask.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an extreme ultraviolet (EUV) pellicle for protection of a photomask, the method comprising:
    preparing a pellicle region of a pellicle layer of a semiconductor material, including:
        applying a layer of the semiconductor material to an exposed surface of a substrate to form the pellicle layer,
        forming at least one support structure from the substrate, and
        removing a portion of the substrate to expose a pellicle region of a previously covered bottom surface of the pellicle layer; and
    anodizing at least the pellicle region of the pellicle layer until a transmissivity of the pellicle region to EUV electromagnetic radiation including a range of wavelengths of electromagnetic radiation of from about 4 nanometers to about 125 nanometers reaches at least a desired transmissivity value.

2. The method of claim 1, wherein the anodizing of at least the pellicle region includes exposing a top surface of the pellicle region to a respective first anodizing solution with which a first electrode is in electrical communication, the first electrode being one of an anode or a cathode, and exposing the bottom surface of the pellicle region to a respective second anodizing solution with which a second electrode is in electrical communication, the second electrode being the other of the anode or the cathode.

3. The method of claim 2, wherein the exposing of each of the top surface of the pellicle region and the bottom surface of the pellicle region includes:
    forming a respective fluid-tight chamber with the respective surface, the chamber including at least a first wall substantially perpendicular to and sealingly engaging the respective surface, the first wall also sealingly engaging an end wall substantially parallel to and spaced apart from the respective surface, a fluid entrance, a fluid exit, and the respective electrode;
    supplying the respective anodizing solution to the respective fluid-tight chamber through the respective fluid entrance;
    applying an electrical potential to the respective electrode; and
    removing the respective anodizing solution from the respective fluid-tight chamber through the respective fluid exit.

4. The method of claim 2, wherein the anodizing of at least the pellicle region includes exposing the top surface of the pellicle region and the bottom surface of the pellicle region to the respective anodizing solution for at least a predefined period in a range of from about 1 second to about 10000 seconds.

5. The method of claim 2, wherein at least one of the first anodizing solution or the second anodizing solution includes hydrofluoric acid.

6. The method of claim 1, wherein the predefined range of wavelengths includes a range of from about 4 nanometers to about 40 nanometers.

7. The method of claim 1, wherein the pellicle layer semiconductor material includes silicon.

8. The method of claim 7, further comprising inducing tension in the pellicle layer by including at least one of a p-type impurity or an n-type impurity in the pellicle layer semiconductor material.

9. The method of claim 1, wherein the desired transmissivity value is at least about 70%.

10. The method of claim 1, wherein the anodizing continues until pores of from about 1 nanometer to about 100 nanometers in size form substantially throughout the pellicle region.

11. A method of forming a pellicle with at least a desired transmissivity to electromagnetic radiation in a range of wavelengths of from about 4 nanometers to about 125 nanometers, the method comprising:
    forming a pellicle layer of a semiconductor material on a wafer, the wafer including at least a substrate layer;
    applying a bottom protective layer to a bottom surface of the wafer;
    applying a top protective layer to a top surface of the pellicle layer;
    applying at least one masking element to the bottom masking layer;
    removing an unmasked portion of the bottom protective layer to expose a portion of a bottom of the wafer;
    removing the at least one masking element to expose at least one corresponding remaining portion of the bottom protective layer;
    removing the exposed portion of the bottom of the wafer, a remaining portion of the bottom protective layer, and the top protective layer to expose a portion of a lower surface of the pellicle layer and at least a portion of a top surface of the pellicle layer corresponding to the exposed bottom surface of the pellicle layer, thereby forming a processing article; and
    anodizing the processing article to form the pellicle throughout a pellicle region of the pellicle layer at least corresponding to the exposed portion of the bottom surface of the pellicle layer to form the pellicle.

12. The method of claim 11, wherein the anodizing of the processing article includes exposing the top surface of the pellicle layer to a first anodizing solution in which is immersed one of a cathode and an anode, and exposing the bottom surface of the pellicle layer to a second anodizing solution in which is immersed the other of the cathode and the anode.

13. The method of claim 11, wherein the wafer includes a silicon-on-insulator (SOI) wafer with at least a handle wafer, a bottom oxide (BOX) layer, and the substrate layer, the applying of the bottom protective layer to the bottom surface of the wafer includes applying the bottom protective layer to a bottom surface of the handle wafer, the removing of the unmasked portion of the bottom protective layer to expose the portion of the bottom of the wafer includes exposing a portion of the bottom of the handle wafer, and the removing of the exposed portion of the bottom of the wafer includes removing the exposed portion of the bottom of the handle wafer, removing a portion of a bottom of the BOX layer exposed thereby to expose a portion of a bottom of the substrate layer, and removing the exposed portion of the bottom of the substrate layer.

14. The method of claim 13, further comprising oxidizing exposed portions of the substrate layer, the top protective layer, and the bottom protective layer before removing the exposed portion of the substrate layer, a remaining portion of the bottom protective layer, and the top protective layer, such that removing includes removing any oxide formed on the exposed portion of the substrate layer.

15. The method of claim 11, wherein the anodizing of the processing article continues until a pellicle thickness of from about 10 nanometers (nm) to about 2.5 microns is achieved.

16. A method of forming an extreme ultraviolet (EUV) porous semiconductor pellicle for protecting a photolithographic photomask, the pellicle having a transmissivity of at least 70% in a range of wavelengths in the electromagnetic radiation spectrum of from about 4 nanometers to about 125 nanometers, the method comprising:
  forming a pellicle layer of a semiconductor material on a wafer, the wafer including at least a handle wafer, a bottom oxide (BOX) layer, and a substrate layer;
  applying a bottom protective layer to a bottom surface of the handle wafer;
  applying a top protective layer to a top surface of the pellicle layer;
  applying at least one masking element to the bottom protective layer;
  removing an unmasked portion of the bottom protective layer to expose a portion of a bottom of the handle wafer;
  removing the at least one masking element to expose at least one corresponding remaining portion of the bottom protective layer;
  removing the exposed portion of the bottom of the handle wafer, removing a portion of a bottom of the BOX layer exposed thereby to expose a portion of a bottom of the substrate layer, and removing the exposed portion of the bottom of the substrate layer, a remaining portion of the bottom protective layer, and the top protective layer to expose a portion of a lower surface of the pellicle layer and at least a portion of a top surface of the pellicle layer corresponding to the exposed bottom surface of the pellicle layer, thereby forming a processing article; and
  anodizing the processing article to form the pellicle throughout a pellicle region of the pellicle layer at least corresponding to the exposed portion of the bottom surface of the pellicle layer to form the pellicle.

17. The method of claim 16, further comprising oxidizing exposed portions of the substrate layer, the top masking layer, and the bottom masking layer before removing the exposed portion of the substrate layer, a remaining portion of the bottom masking layer, and the top masking layer, such that removing includes removing any oxide formed on the exposed portion of the substrate layer.

18. The method of claim 16, wherein the anodizing of processing article includes circulating a first anodizing solution along at least a portion of a top surface of the pellicle region while energizing a first electrode in electrical communication with the first anodizing solution, and circulating a second anodizing solution along at least a portion of the bottom surface of the pellicle region while energizing a second electrode in electrical communication with the second anodizing solution, one of the first electrode or the second electrode being an anode and the other of the first electrode or the second electrode being a cathode.

19. The method of claim 18, wherein the circulating of the first anodizing solution and the second anodizing solution continues for a period in the range of from at least 1 second to at least about 10000 seconds.

20. The method of claim 18, wherein the circulating of the first anodizing solution and the second anodizing solution continues until the pellicle region achieves a thickness of from about 10 nanometers (nm) to about 2.5 microns.

* * * * *